(12) United States Patent
Cheng et al.

(10) Patent No.: US 9,105,606 B2
(45) Date of Patent: Aug. 11, 2015

(54) SELF ALIGNED CONTACT WITH IMPROVED ROBUSTNESS

(71) Applicant: International Business Machines Corporation, Armonk, NY (US)

(72) Inventors: Kangguo Cheng, Guilderland, NY (US); Ali Khakifirooz, Los Altos, CA (US); Shom Ponoth, Gaithersburg, MD (US); Raghavasimhan Sreenivasan, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/522,119

(22) Filed: Oct. 23, 2014

(65) Prior Publication Data

US 2015/0041868 A1    Feb. 12, 2015

Related U.S. Application Data

(62) Division of application No. 13/613,436, filed on Sep. 13, 2012, now Pat. No. 9,034,703.

(51) Int. Cl.
| H01L 29/51 | (2006.01) |
| H01L 29/423 | (2006.01) |
| H01L 21/28 | (2006.01) |
| H01L 29/49 | (2006.01) |
| H01L 29/66 | (2006.01) |
| H01L 29/78 | (2006.01) |

(52) U.S. Cl.
CPC .... *H01L 29/42364* (2013.01); *H01L 21/28079* (2013.01); *H01L 29/495* (2013.01); *H01L 29/511* (2013.01); *H01L 29/66545* (2013.01); *H01L 29/78* (2013.01); *H01L 29/7833* (2013.01)

(58) Field of Classification Search
CPC ............ H01L 21/28079; H01L 29/495; H01L 29/66545; H01L 29/78; H01L 29/7833
USPC ......................................................... 257/288
See application file for complete search history.

(56) References Cited

U.S. PATENT DOCUMENTS

| 5,831,899 | A | 11/1998 | Wang et al. |
| 6,100,128 | A | 8/2000 | Wang et al. |
| 6,114,734 | A | 9/2000 | Eklund |
| 6,635,566 | B1 | 10/2003 | Blosse et al. |
| 7,026,689 | B2 | 4/2006 | Liaw |
| 7,820,537 | B1 | 10/2010 | Kim |
| 7,867,911 | B2 | 1/2011 | Nam et al. |
| 8,048,790 | B2 | 11/2011 | Soss et al. |
| 8,753,970 | B2 | 6/2014 | Xie et al. |
| 2003/0151051 | A1 | 8/2003 | Johnson et al. |
| 2010/0163952 | A1 | 7/2010 | Jan et al. |

(Continued)

*Primary Examiner* — Savitr Mulpuri
(74) *Attorney, Agent, or Firm* — Scully, Scott, Murphy & Presser, P.C.; H. Daniel Schnurmann (57) ABSTRACT

A semiconductor device is provided that includes a gate structure that is present on a channel portion of a semiconductor substrate that is present between a source region and a drain region. The gate structure includes at least a gate conductor and a gate sidewall spacer that is adjacent to the at least one gate conductor. An upper surface of the gate conductor is recessed relative to an upper surface of the gate sidewall spacer. A multi-layered cap is present on the upper surface of the gate conductor. The multi-layered cap includes a high-k dielectric material and a dielectric cap spacer that is present on a portion of the high-k dielectric material that is present on the sidewall of the gate sidewall spacer.

18 Claims, 3 Drawing Sheets

(56) References Cited

U.S. PATENT DOCUMENTS

| | | |
|---|---|---|
| 2011/0156107 A1 | 6/2011 | Bohr et al. |
| 2011/0298017 A1 | 12/2011 | Jain et al. |
| 2012/0139056 A1 | 6/2012 | Wallner et al. |
| 2012/0164807 A1 | 6/2012 | Sun et al. |
| 2013/0175579 A1 | 7/2013 | Cheng et al. |
| 2013/0248952 A1* | 9/2013 | Rosenbaum et al. ......... 257/288 |
| 2013/0249020 A1 | 9/2013 | Cheng et al. |
| 2013/0256767 A1* | 10/2013 | Pradhan et al. ............... 257/288 |
| 2013/0270614 A1* | 10/2013 | Yamasaki ..................... 257/288 |
| 2013/0307033 A1* | 11/2013 | Kanakasabapathy et al. ............................. 257/288 |
| 2014/0035010 A1 | 2/2014 | Cai et al. |
| 2014/0061659 A1 | 3/2014 | Teplik et al. |
| 2014/0117425 A1* | 5/2014 | Pradhan et al. ............... 257/288 |
| 2014/0162452 A1 | 6/2014 | Cheng et al. |
| 2014/0197468 A1 | 7/2014 | Xie et al. |
| 2015/0041926 A1* | 2/2015 | Pradhan et al. ............... 257/412 |

* cited by examiner

SELF ALIGNED CONTACT WITH IMPROVED ROBUSTNESS

BACKGROUND

The present disclosure relates generally to semiconductor integrated circuits. More particularly, the present disclosure relates to scaling of semiconductor devices, such as metal oxide semiconductor field effect transistors (MOSFETs). In order to be able to make integrated circuits, such as memory, logic, and other devices, of higher integration density than currently feasible, one has to find ways to further downscale the dimensions of field effect transistors (FETs), such as MOSFETs and complementary metal oxide semiconductors (CMOS). Scaling achieves compactness and improves operating performance in devices by shrinking the overall dimensions of the device.

SUMMARY

The present disclosure provides a method of forming a semiconductor device that includes providing a gate structure on a channel portion of semiconductor substrate that is present between a source region and a drain region of the semiconductor substrate, wherein the gate structure includes a gate sidewall spacer that is adjacent to a gate conductor of the gate structure. An interlevel dielectric layer is formed over the source region and the drain region. An upper surface of the interlevel dielectric layer is coplanar with an upper surface of the gate structure. The gate conductor is recessed relative to the interlevel dielectric layer. A multi-layered cap is formed on a recessed surface of the gate conductor, wherein at least one layer of the multi-layered cap is comprised of a high-k dielectric material and is positioned on a sidewall of the gate sidewall spacer that extends beyond an upper surface of the gate conductor. Via openings are formed by an etch process to the source and drain regions of the semiconductor device. The high-k dielectric material protects a sidewall of the gate conductor during the etch process for forming the via openings.

In another embodiment, the method of forming a semiconductor device may include providing a gate structure on a channel portion of a semiconductor substrate, wherein a gate sidewall spacer is adjacent to the gate structure and an interlevel dielectric layer is positioned adjacent to the gate sidewall spacer. The interlevel dielectric layer is present on a source region and a drain region that are present on opposing sides of the channel portion of the semiconductor substrate. The upper surface of the gate conductor is recessed relative to the interlevel dielectric layer. A multi-layered cap is formed on a recessed surface of the gate conductor. At least one layer of the multi-layered cap is comprised of a high-k dielectric material and is present on a sidewall of the gate sidewall spacer that extends beyond an upper surface of the gate conductor. Via openings are formed by an etch process to the source region and the drain region of the semiconductor device. The high-k dielectric material protects a sidewall of the gate conductor during the etch process for forming the via openings.

In another aspect, a semiconductor device is provided that includes a gate conductor that is electrically insulated from shorting to the interconnect contact of a source region and/or a drain region by a multi-layered cap that includes a high-k dielectric layer that is present on a sidewall of the gate sidewall spacer and a dielectric cap spacer. The semiconductor device comprises a gate structure that is present on a channel portion of a semiconductor substrate that is present between a source region and a drain region. The gate structure includes at least a gate conductor and a gate sidewall spacer that is adjacent to the gate conductor, wherein an upper surface of the gate conductor is recessed relative to an upper surface of the gate sidewall spacer. A multi-layered cap is present on the upper surface of the gate conductor, wherein the multi-layered cap includes a high-k dielectric material that is present on a portion of a sidewall of the gate sidewall spacer that extends beyond an upper surface of the gate conductor. The multi-layered cap also includes a dielectric cap spacer that is present on a portion of the high-k dielectric material that is present on the sidewall of the gate sidewall spacer.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

It has been determined that one consequence of scaling semiconductor devices, such as field effect transistors (FETs), is that as the distance between adjacent semiconductor devices is decreased it becomes increasingly difficult to form interconnects to the source and drain regions of the semiconductor devices without shorting to the gate structures. It has been determined that the corner of the gate structure, i.e., gate conductor, is susceptible to being shorted by a misaligned interconnect contact that is intended to contact a source and/or drain region of a semiconductor device. More specifically, the etch process for forming the via openings to the source and drain regions when misaligned can damage the conventional dielectric cap that is present atop the gate conductor and/or the gate sidewall spacer that is adjacent to the gate conductor to expose a sidewall portion of the gate conductor. Thereafter, the conductive material that is deposited in the via opening for providing electrical communication to the source region and/or the drain region disadvantageously also contacts the exposed portion of the gate conductor. This can cause a short between the gate conductor and the source region and/or the drain region.

In one aspect, the present disclosure provides a multi-layered cap that includes a high-k dielectric material that is present over the sidewall of the gate conductor of the gate structure of a semiconductor device. More specifically, the multi-layered cap is present on a recessed upper surface of the gate conductor, wherein the portion of the high-k dielectric material that is present over the sidewall portion of the gate conductor is present on a sidewall surface of a gate sidewall spacer that extend above the recessed surface of the gate conductor. The high-k dielectric material can protect the sidewall of the gate conductor during the etch processes for forming the via openings to the source regions and drain regions to ensure that the sidewall of the gate conductor is not exposed by the etch process for forming the via openings. The multi-layered cap may allow for a self aligned interconnect contact forming process that substantially eliminates shorting to the gate structure.

FIGS. 1-5 depict a method of forming interconnect contacts 50 to the source region 20 and the drain region 25 of a semiconductor device 100 that utilizes a multi-layered cap 30 to electrically isolate the gate conductor 35 from being shorted to the interconnects 50 to the source and drain regions 20, 25 of the semiconductor device 100. The method depicted in FIGS. 1-5 is suitable for forming any semiconductor device including a functional gate structure 10. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity.

In one embodiment, the semiconductor device 100 is a field effect transistor (FET). A field effect transistor (FET) is a semiconductor device 100 in which output current, i.e., source-drain current, is controlled by the voltage applied to a functional gate structure 10. A field effect transistor has three terminals, i.e., a functional gate structure 10, a source region 20, and a drain region 25. The functional gate structure 10 is a structure used to control output current, i.e., flow of carriers in the channel, i.e., channel portion 4, of a semiconducting device 100, such as a field effect transistor, through electrical or magnetic fields. The channel portion 4 of the semiconductor substrate 5 is between the source region 20 and the drain region 25 of a field effect transistor (FET) that becomes conductive when the semiconductor device 100 is turned on. The source region 20 is a doped region in the semiconductor device 100, in which majority carriers are flowing into the channel portion 4 of the semiconductor substrate 5. The drain region 25 is the doped region in the semiconductor device 100 that is located at the end of the channel portion 4 of the semiconductor substrate 5, in which carriers are flowing out of the semiconductor device 100 through the drain region 25. Although, FIGS. 1-5 of the present disclosure depict a field effect transistor (FET), any semiconductor device having a functional gate structure 10 is applicable to the present disclosure.

Figure 1:
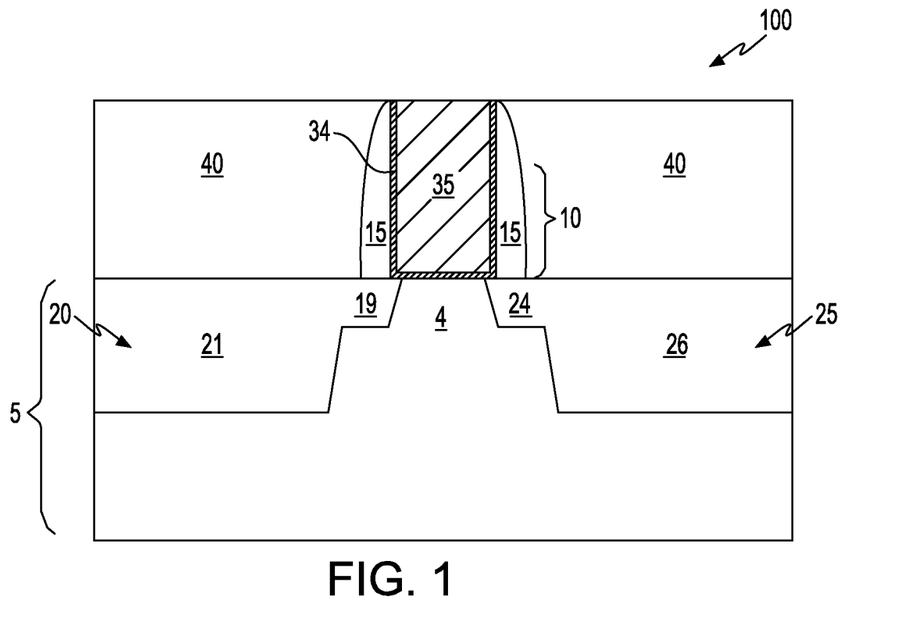
FIG. 1 is a side cross-sectional view depicting one embodiment of an initial structure of the disclosed method including a functional gate structure on a semiconductor substrate, in accordance with the present disclosure.

FIG. 1 illustrates the results of the initial processing steps that produce a functional gate structure 10 on a semiconductor substrate 5 including a gate conductor 35, a source region 20 and a drain region 25 present in the semiconductor substrate 5 on opposing sides of the functional gate structure 10, and at least one gate sidewall spacer 15 adjacent to the functional gate structure 10. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5. The semiconductor substrate 5 may also include a doped (n- or p-) region. For clarity, the doped regions are not specifically labeled in the drawings of the present application. These doped regions are known as "wells".

In some embodiments, the functional gate structure that is depicted in FIG. 1 is formed using a replacement gate process, which is also referred to as a "gate last process". The replacement gate process employs a sacrificial material, i.e., sacrificial gate or replacement gate structure (not depicted), that defines the geometry of later formed functional gate structures 10 that function to switch the semiconductor device from an "on" to "off" state, and vice versa. The replacement gate structure may be composed of a single layer of sacrificial material. In some instances, the replacement gate structure may include a sacrificial material stack.

The replacement gate structure may be composed of a semiconductor containing material, such as a silicon containing material. Silicon containing materials that are suitable for the replacement gate structure include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the replacement gate structure is amorphous silicon. In some embodiments, other materials, such as dielectrics and metals, can be employed as the sacrificial material of the replacement gate structure, so long as the material selected can be removed selective to the semiconductor substrate and the subsequently formed interlevel dielectric.

The sacrificial material layer that provides the replacement gate structure may be formed using a deposition process, such as chemical vapor deposition (CVD). Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof. The sacrificial material may also be deposited using evaporation, chemical solution deposition, spin on deposition, and physical vapor deposition (PVD) methods. The sacrificial material may be patterned and etched to provide the replacement gate structure. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. For example, the selectivity may be greater than 50:1. In another example, selectivity may be greater than 100:1.

The etch process typically removes the exposed portions of the sacrificial material layer with an etch chemistry that is selective to the semiconductor substrate 5. In one embodiment, the etch process that forms the replacement gate structures is an anisotropic etch. An "anisotropic etch process" is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Referring to FIG. 1, in a replacement gate process sequence, after forming the replacement gate structure, source and drain extension regions 19, 24 may be formed in the semiconductor substrate 5. The source and drain extension regions 19, 24 may be formed via ion implantation. When the semiconductor device 100 is a p-type conductivity semiconductor device, the source and drain extension regions 19, 24 may be doped with a p-type dopant. When the semiconductor device 100 is an n-type semiconductor device, the source and drain extension regions 19, 24 may be doped with an n-type dopant. As used herein, "p-type" refers to the addition of impurities to an intrinsic semiconductor that creates deficiencies of valence electrons. The p-type conductivity semiconductor devices are typically produced within silicon containing substrates by doping the source and drain extension regions 19, 24 adjacent to the replacement gate structure with elements from group III-A of the Periodic Table of Elements. In a silicon containing substrate, examples of p-type dopants, i.e., impurities, include but are not limited to boron, aluminum, gallium and indium. As used herein, "n-type" refers to the addition of impurities that contributes free electrons to an intrinsic semiconductor. The n-type conductivity semiconductor devices are typically produced within silicon containing substrates by doping the source and drain extension regions 19, 24 with elements from group V-A of the Periodic Table of Elements. In a silicon containing substrate, examples of n-type dopants, i.e., impurities, include but are not limited to, antimony, arsenic and phosphorous. The source and drain extension regions 19, 24 may extend slightly beneath the edge of the replacement gate structure. Because the replacement gate structure is later substituted with a functional gate structure 10, the source and drain extension regions 19, 24 may extend slightly beneath the edge of the functional gate structure 10, as depicted in FIG. 1.

Still referring to FIG. 1, a gate sidewall spacer 15 can be formed adjoining the sidewall surfaces of the replacement gate structure. The gate sidewall spacer 15 can be composed of silicon oxide, silicon nitride, boron nitride, silicon carbon or any suitable combination of those materials. The gate sidewall spacer 15 may be formed by deposition and etching. Typically, the widths of the gate sidewall spacer 15 should be sufficiently wide enough so that the following deep source/drain implants also do not encroach significantly into the channel portion 4 of the semiconductor substrate 5 to cause short channel effects in the semiconductor device 100. The gate sidewall spacer 15 may have a width measured at the bottom of the spacer that is no greater than 20 nm.

Still referring to FIG. 1, a higher energy ion implant than the ion implant used to form the source and drain extension regions 19, 24 is conducted to form deep source and drain regions 21, 26. Typically, these implants are also conducted at a higher concentration of dopant than the implant for the source and drain extension regions 19, 24. The deep source and drain regions 21, 26 are typically doped with a conductivity type consistent with the corresponding source and drain extension regions 19, 24. In some embodiments, the deep source and drain regions 19, 24 may be omitted.

In some embodiments, the source region 20 and the drain region 25 for the semiconductor device 100 is a combination of the source and drain extension regions 19, 24 and the optional deep source and drain regions 21, 26. The source and drain regions 20, 25 may each further include a raised source and drain region (not shown). Raised source and drain regions typically have the same conductivity as the corresponding source and drain extension regions 19, 24, and deep source and drain regions 21, 26. The raised source and drain region has an upper surface that is vertically offset and above the upper surface of the channel portion 4 for the semiconductor substrate 5. The raised source and drain regions are typically formed using epitaxial growth, and may be in-situ doped during the growth process. Alternatively, the raised source and drain regions may be implanted using ion implantation following the growth process. The source and drain regions 20, 25 can be activated by activation annealing. Activation anneal may be conducted at a temperature ranging from 850° C. to 1350° C.

Referring to FIG. 1, a first interlevel dielectric layer 40 may be formed on the semiconductor substrate 5 having an upper surface that is coplanar with an upper surface of the replacement gate structure. The first interlevel dielectric layer 40 may be blanket deposited atop the entire semiconductor substrate 5 and planarized. The first interlevel dielectric layer 40 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). Additional choices for the first interlevel dielectric layer 40 includes any of the aforementioned materials in porous form, or in a form that changes during processing to or from being porous and/or permeable to being non-porous and/or non-permeable.

The first interlevel dielectric layer 40 may be formed using a deposited process, such as chemical vapor deposition (CVD). Variations of CVD processes that are suitable for forming the first interlevel dielectric layer 40 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The first interlevel dielectric layer 40 may also be deposited using evaporation, chemical solution deposition, spin on deposition, and physical vapor deposition (PVD) methods. Following deposition, the first interlevel dielectric layer 40 may be planarized so that the upper surface of the first interlevel dielectric layer 40 is coplanar with the upper surface of the replacement gate structure. Planarization is a material removal process that employs at least mechanical forces, such as frictional media, to produce a planar surface. The first interlevel dielectric layer 40 may be planarized using chemical mechanical planarization (CMP).

After forming the first interlevel dielectric layer 40, the replacement gate structure can be removed to provide an opening to channel portion 4 of the semiconductor substrate 5. The sidewalls of the opening may be provided by the sidewalls of the gate sidewall spacer 15 and the base of the opening may be provided by the channel portion 4 of the semiconductor substrate 5. The replacement gate structure may be removed using a selective etch process that removes the replacement gate structure selectively to the semiconductor substrate 5, the gate sidewall spacer 15 and the first interlevel dielectric layer 40. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the replacement gate structure is composed of polysilicon, the semiconductor substrate 5 is a silicon-containing material, the gate sidewall spacer 15 is composed of silicon oxide ($SiO_2$), and the first interlevel dielectric layer 40 is composed of nitride ($Si_3N_4$), the wet etch chemistry for removing the replacement gate structure may be composed of DHF and hot $NH_3$, or TetraMethyl Ammonium Hydroxide (TMAH).

In some embodiments, after the replacement gate structure is removed, the functional gate structure 10 is formed in the opening that exposes the channel portion 4 of the semiconductor substrate 5, as depicted in FIG. 1. The functional gate structure 10 may include at least one gate dielectric 34 and at least one gate conductor 25. The at least one gate dielectric 34 can be deposited on the sidewalls, e.g., sidewalls of the gate sidewalls spacer 15, and the base of the opening to the channel portion 4 of the semiconductor substrate 5. The at least one gate dielectric 34 may be composed of a high-k dielectric. The term "high-k" denotes a material having a dielectric constant that is greater than the dielectric constant of silicon oxide ($SiO_2$). More specifically, in one embodiment, a high-k dielectric has a dielectric constant that is greater than 4.0. In another embodiment, a high-k dielectric has a dielectric constant of 10 or greater, e.g., 10.1. In another embodiment, a high-k dielectric material has a dielectric constant greater than 15.0. In yet another embodiment, a high-k dielectric has a dielectric constant ranging from 10 to 30. The dielectric constants mentioned herein are relative to a vacuum at room temperature, i.e., 20° C. to 25° C.

Some examples of high-k dielectric materials suitable for the at least one gate dielectric layer 34 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the at least one gate dielectric layer 34 is hafnium oxide ($HfO_2$).

The at least one gate dielectric layer 34 can be formed using deposition methods. The at least one gate dielectric layer 34 is typically a conformal layer that is formed using a conformal deposition process. The term "conformal" denotes a layer having a thickness that does not deviate from greater than or less than 30% of an average value for the thickness of the layer. In one example, the at least one gate dielectric layer 34 is formed in direct contact with the upper surface of the first interlevel dielectric layer 40, the exposed sidewall surfaces of the gate sidewall spacer 15 that provides the sidewalls of the opening, and the base of the opening, i.e., the channel portion 4 of the semiconductor substrate 5.

The at least one gate dielectric 34 can be formed using a deposition process, such as chemical vapor deposition (CVD). Variations of chemical vapor deposition (CVD) processes for depositing the at least one gate dielectric layer 34 include, but are not limited to, Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the at least one gate dielectric layer 34 may be formed by a thermal growth process such as, for example, oxidation, nitridation or oxynitridation. Each of the at least one gate dielectric 34 has a thickness that ranges from 0.5 nm to 10 nm. In another embodiment, each of the at least one gate dielectric 34 has a thickness that ranges from 1 nm to 5 nm.

Prior to forming the at least one gate dielectric 34, an interfacial dielectric layer (not shown) can be formed on the channel portion 4 of the semiconductor substrate 5. The interfacial dielectric layer is typically provided by thermal oxidation. In one embodiment, thermal oxidation of silicon is performed in the presence of oxygen at a temperature between 400° C. and 1200° C. In some examples, the oxidant may be either water vapor (steam) or molecular oxygen. The interfacial dielectric layer is typically provided by chemical oxidation. Chemical oxide can be formed by exposing silicon surface to SC1 solution (an aqueous solution containing ammonia and peroxide). In another embodiment, the interfacial dielectric layer is an oxide that is formed using deposition. In some embodiments, the interfacial dielectric layer is composed of silicon oxide and has a thickness that ranges from 0.5 nm to 5 nm. In some embodiments, the interfacial dielectric layer is composed of nitrogen. Nitrogen can be incorporated into the interfacial dielectric layer, for example, by nitrogen plasma process. The at least one gate dielectric 34 can be formed in direct contact with the interfacial dielectric layer.

FIG. 1 further depicts one embodiment of forming the at least one gate conductor 35 of the functioning gate structure 10 within the opening to the channel portion 4 of the semiconductor substrate 5 that was formed by removing the replacement gate structure. The at least one gate conductor 35 may be composed of a work functional metal layer, that is in direct contact with the at least one gate dielectric layer 34. The term "direct contact" means that a first element, such as a first structure, and a second element, such as a second structure, are connected without any intermediary conducting, insulating or semiconductor layers at the interface of the two elements. In one embodiment, in which the semiconductor device 100 is an n-type semiconductor device, the work function metal layer is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. The n-type work function metal layer can be composed of at least one of TiAl, TaN, TiN, HfN, HfSi, or combinations thereof. The n-type work function metal layer can be deposited using chemical vapor deposition (CVD), atomic layer deposition (ALD), sputtering or plating. The n-type work function metal layer may be composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

In one embodiment, in which the semiconductor device 100 is a p-type semiconductor device, the work function metal layer that provides the at least one gate conductor 35 may be a p-type work function metal layer. As used herein, a "p-type work function metal layer" is a metal layer that effectuates a p-type threshold voltage shift. The work function of the p-type work function metal layer can range from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. The p-type work function metal layer may be composed of titanium and their nitrided/carbide. The p-type work function metal layer may be composed of titanium nitride (TiN). The p-type work function metal layer may also be composed of TiAlN, Ru, Pt, Mo, Co and alloys and combinations thereof. The p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD). Besides n-type and p-type work function metal layers, other metal layers with workfunction between 4.2 eV and 4.9 eV can also be used.

The above description for forming the functional gate structure 10 is one example of a "replacement gate process", which is also referred to as a "gate last process". The present disclosure is not limited to only this process sequence. For example, the initial structure depicted in FIG. 1 may also be formed using a gate first process. In a gate first process, the material layers for the functional gate structure 10 are deposited on the semiconductor substrate 5 before forming the source and drain regions 20, 25. The compositions for the at least one gate dielectric 34 and the at least one gate conductor 35 of the functional gate structure 10 are described above. The functional gate structure 10 may be patterned and etched similar to the replacement gate structure 10. In a gate first process, after the formation of the functional gate structure 10, the source and drain regions 20, 25 may be formed in the semiconductor substrate 5. The gate sidewall spacer 15 may be formed adjacent to the functional gate structure 10 during the process sequence for forming the source and drain regions 20, 25. Thereafter, the first interlevel dielectric layer 40 is then formed using the above described deposition and planarization processes to provide a first interlevel dielectric layer 40 having an upper surface that is coplanar with the upper surface of the functional gate structure 10. The following description for the disclosed method is equally applicable to both a gate last process sequence, i.e., replacement gate process, a gate first process sequence.

Figure 2:
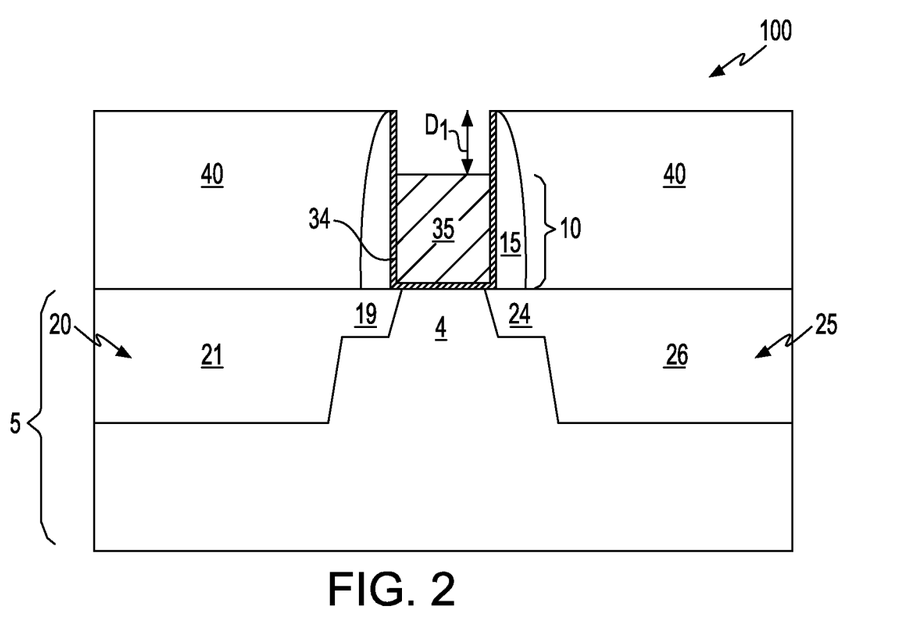
FIG. 2 is a side cross-sectional depicting one embodiment of recessing the gate conductor of the functional gate structure, in accordance with the present disclosure.

FIG. 2 depicts one embodiment of recessing the at least one gate conductor 35 of the functional gate structure 10. The at least one gate conductor 35 may be recessed by an anisotropic etch. Examples of anisotropic etch process that are suitable for recessing the at least one gate conductor 35 include reactive ion etch (RIE), ion beam etching, plasma etching or laser ablation. The etch process that recesses the at least one gate conductor 35 may be selective to the first interlevel dielectric layer 40 and the at least one gate dielectric 34. Therefore, following etching the recessed upper surface of the at least one gate conductor 35 may be vertically offset from the upper surface of the first interlevel dielectric layer 40 by a dimension D1 ranging from 10 nm to 100 nm. In another embodiment, following etching the recessed upper surface of the at least one gate conductor 35 may be vertically offset from the upper surface of the first interlevel dielectric layer 40 by a dimension D1 ranging from 30 nm to 50 nm. Following the recessing of the at least one gate conductor 35, the remaining portion of the at least one gate conductor 35 may have a thickness ranging from 1 nm to 50 nm. In another embodiment, the remaining portion of the at least one gate conductor 35 may have a thickness ranging from 5 nm to 30 nm. In one example, when the at least one gate conductor 35 is composed of tungsten, the first interlevel dielectric layer 40 is composed of silicon oxide, the gate sidewall spacer 15 is composed of silicon nitride, and the at least one gate dielectric 34 is composed of hafnium oxide ($HfO_2$), the etch chemistry for recessing the at least one gate conductor 35 may be composed of chlorine.

Figure 3A:
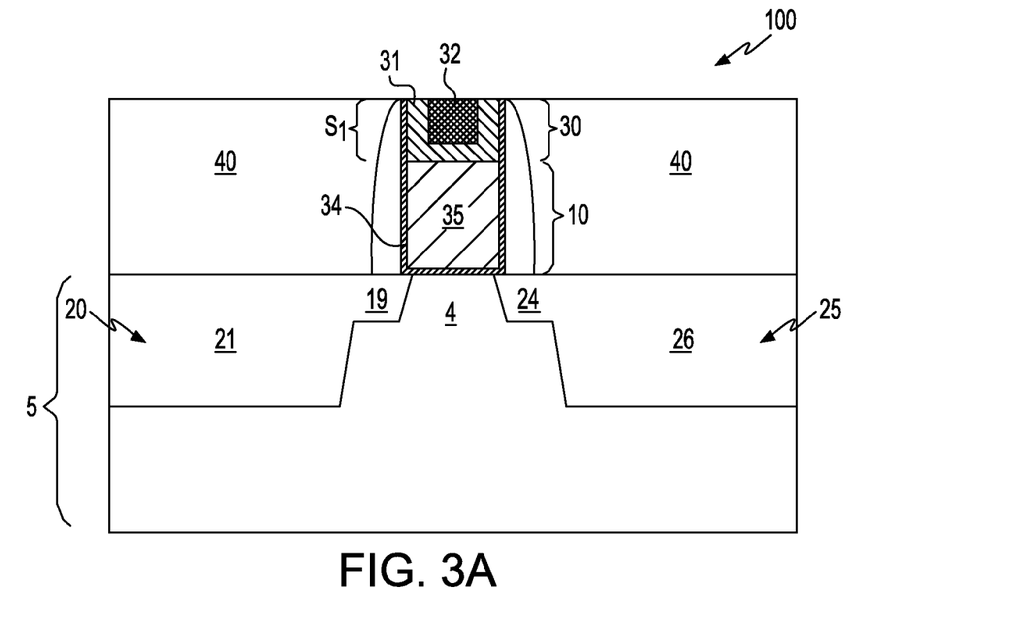
FIG. 3A is a side cross-sectional view of one embodiment of a multi-layered cap that is formed on the recessed surface of the gate conductor, in which the multi-layered cap includes a high-k dielectric material and a dielectric fill, in accordance with the present disclosure.
Figure 3B:
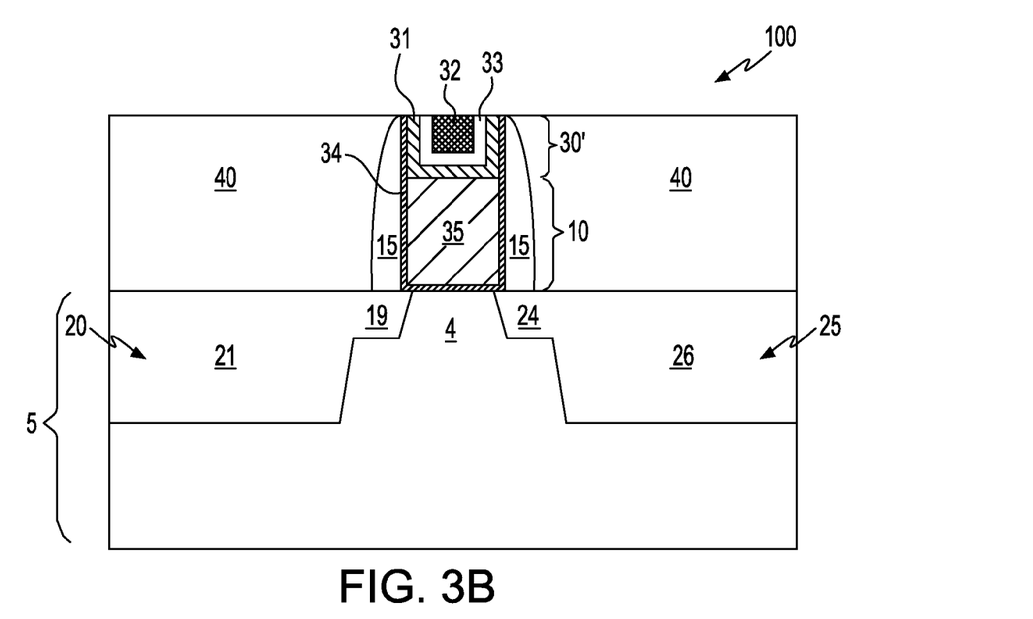
FIG. 3B is a side cross-sectional view of one embodiment of a multi-layered cap that is formed on the recessed surface of the gate conductor, in which the multi-layered cap includes a high-k dielectric material, an intermediate dielectric layer, and a dielectric fill, in accordance with the present disclosure.

FIGS. 3A and 3B depicts some embodiments of the present disclosure in which a multi-layered cap 30, 30' is formed in the recess that is present over the functional gate structure 10 that is defined by the recessed upper surface of the at least one gate conductor 35 and the sidewalls of the gate sidewall spacer 15 that were exposed by recessing the upper surface of the at least one gate conductor 35. In one embodiment, the multi-layered cap 30 includes a high-k dielectric material 31 and a dielectric fill material 32, as depicted in FIG. 3A. In another embodiment, the multi-layered cap 30' includes a high-k dielectric material 31, an intermediate dielectric layer 33 and a dielectric fill 32, as depicted in FIG. 3B.

Referring to FIGS. 3A and 3B, a portion of the high-k dielectric material 31 of the multi-layered cap 30, 30' is positioned on a sidewall Si of the gate sidewall spacer 15 that extends beyond the upper surface of the at least one recessed gate conductor 35. The terms "overlying", "atop", "positioned on" or "positioned atop" mean that a first element, such as a first structure, is present on a second element, such as a second structure, wherein intervening elements, such as an interface structure may be present between the first element and the second element. For example, in some embodiments, the high-k dielectric material 31 may be separated from the sidewall S1 of the gate sidewall spacer 15 by the at least one gate dielectric 34. In this embodiment, the high-k dielectric material 31 may be in direct contact with the at least one gate dielectric layer 34, wherein a portion of the at least one gate dielectric layer 34 may be in direct contact with the portion of the sidewall S1 of the gate sidewall spacer 15 that extends beyond the upper surface of the recessed gate conductor 35. In another embodiment, in which the at least one gate dielectric 34 is not present on the portion of the sidewall S1 of the gate sidewall spacer 15 that extends beyond the upper surface of the at least one recessed gate conductor 35, the high-k dielectric material 31 is in direct contact with the sidewall S1 of the gate sidewall spacer 15. In some embodiments, by being positioned on the sidewall S1 of the gate sidewall spacer 15, the high-k dielectric material 31 is present over and protects the sidewall of the gate conductor 35 during the subsequent etch processes that provide the via openings to the source region 20 and the drain region 25.

One high-k dielectric composition that is suitable for the high-k dielectric material 31 is hafnium oxide (HfO$_2$). Other examples of suitable high-k dielectric materials for the high-k dielectric material 31 include hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the composition of the high-k dielectric material 31 is selected so that the etch chemistries used in the subsequent via formation processes to the source and drain regions is selective to the high-k dielectric material 31.

The high-k dielectric material 31 is typically a conformal layer that is formed using a conformal deposition process. In one example, the high-k dielectric material 31 is formed on, or in direct contact with, the upper surface of the at least one recessed gate conductor 35, and the exposed sidewall surfaces of the gate sidewall spacer 15 that extend above the upper surface of the recessed gate conductor. In the embodiments, in which the at least one gate dielectric 34 extends along the sidewall Si of the gate sidewall spacer 15, a portion of the high-k dielectric material 31 may be in contact with the at least one gate dielectric 34, as depicted in FIGS. 3A and 3B. The portions of the high-k dielectric material 31 that are positioned on the recessed gate conductor 35 and the sidewalls of the gate sidewall spacer 15 may be a continuous single layer.

The high-k dielectric material 31 may be formed using a deposition process, such as chemical vapor deposition (CVD). Variations of chemical vapor deposition (CVD) processes for depositing the layer of the high-k dielectric material 31 include, but are not limited to, Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the high-k dielectric material 31 may be formed by a thermal growth process such as, for example, oxidation, nitridation or oxynitridation. In one embodiment, the high-k dielectric material 31 has a thickness that ranges from 0.5 nm to 10 nm, as measured for the deposition surface on which the high-k dielectric material 31 is formed. In another embodiment, the high-k dielectric material 31 has a thickness that ranges from 1 nm to 5 nm.

Referring to FIG. 3A, a dielectric fill 32 can be deposited directly on the high-k dielectric material 31. The dielectric fill 32 is typically composed of a dielectric material having a different composition than the high-k dielectric material 31, but in some embodiments, the dielectric fill 32 and the high-k dielectric material 31 may be composed of the same composition material. In some embodiments, the dielectric fill 32 may be composed of a nitride, oxide or oxynitride material. In one embodiment, the dielectric fill 32 is composed silicon nitride. In another embodiment, the dielectric fill 32 is composed of silicon oxide. Other examples of materials suitable for the dielectric fill 32 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The dielectric fill 32 is typically formed using a deposition method. In one example, the dielectric fill 32 is formed from a blanket deposited material layer. The material layer for the dielectric fill 32 may be blanket deposited so that a portion is present on the upper surface of the first interlevel dielectric layer 40, and may be deposited to a thickness that fills the void over the recessed gate conductor 35 of the functional gate structure 10. Following deposition, the blanket deposited material layer for the dielectric fill 32 may be planarized until the upper surface of the remaining portion of the material for the dielectric fill 32 is coplanar with the upper portion of the first interlevel dielectric layer 40. The planarization process may include chemical mechanical polishing (CMP) or grinding. In one embodiment, the multi-layered cap 30 includes a high-k dielectric material 31 that is composed of hafnium oxide (HfO$_2$) and a dielectric fill 32 that is composed of silicon nitride (Si$_3$N$_4$).

Although FIG. 3A depicts a multi-layered cap 30 of only two material compositions, the present disclosure is not limited to only this example, as the multi-layered cap may have any number of layers and compositions. For example, FIG. 3B depicts one embodiment of the present disclosure in which the multi-layered cap 30' includes an intermediate dielectric layer 33 that is present between the high-k dielectric material 31 and the dielectric fill 32. Similar to the high-k dielectric material 31, the intermediate dielectric layer 33 may be a conformally deposited layer. The intermediate dielectric layer 33 may be formed using a chemical vapor deposition (CVD) method, such as APCVD, LPCVD, PECVD, MOCVD and others. The intermediate dielectric layer 33 can be composed of the same or different material as the high-k dielectric material 31 or may be composed of the same or different material as the dielectric fill 32.

Figure 4:
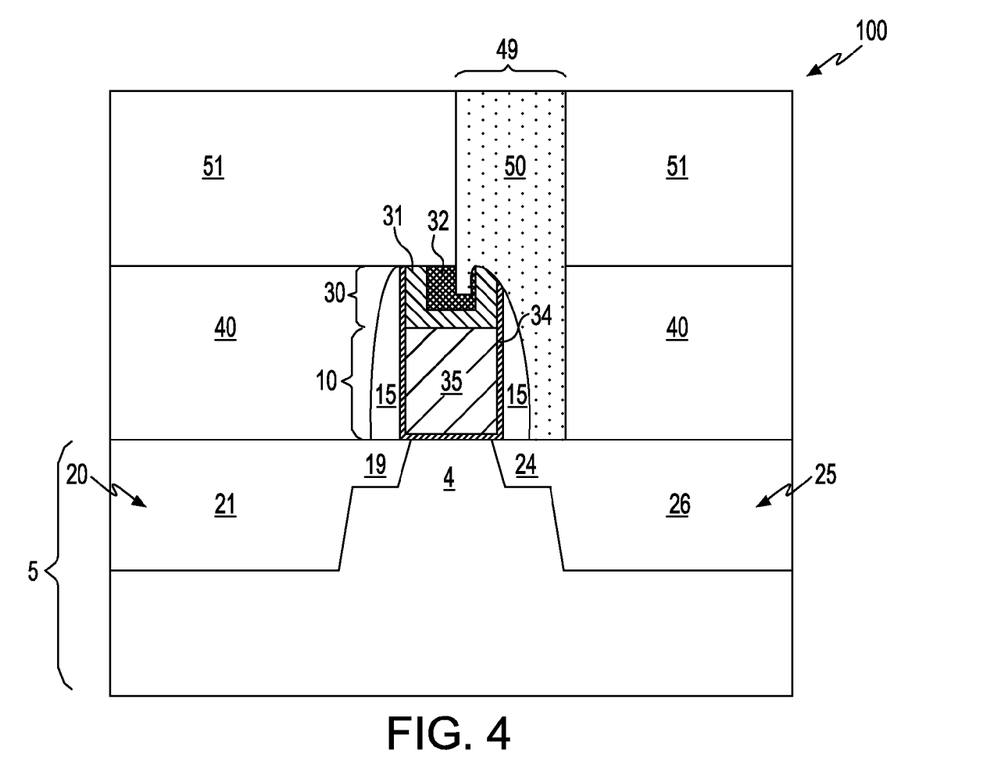
FIG. 4 is a side cross-sectional view of etching via openings through the interlevel dielectric layer selectively to at least the high-k dielectric material of the multi-layered cap, in which the high-k dielectric material protects a sidewall of the gate conductor, and filling the via openings with a conductive material, in accordance with one embodiment of the present disclosure.

FIG. 4 depicts one embodiment of etching via openings 49 through the first interlevel dielectric layer 40 to at least one of the source region 20 and the drain region 25, wherein the high-k dielectric material 31 protects a sidewall of the at least one gate conductor 35. In some embodiments, by protects the sidewall of the at least one gate conductor 35 it is meant that the portion of the high-k dielectric material 31 that is present overlying the sidewall of the at least one gate conductor 35 obstructs the anisotropic etch process that forms the via openings 49 from exposing the sidewall of the at least one gate conductor 35. In some embodiments, the high-k dielectric material 31 has a composition that is substantially not etched by the etch process for forming the via openings 49. In some embodiments, the first interlevel dielectric layer 40 is composed of silicon oxide that can be etched very selectively to high-k dielectric material 31. Because the anisotropic etch process that forms the via openings 49 does not etch the high-k dielectric material 31, and the high-k dielectric material 31 covers the sidewall of the gate conductor 35, the sidewall of the gate conductor 35 is protected by the anisotropic etch that is forming the via openings 49 to the source region 20 and the drain region 25.

Referring to FIG. 4, before forming the via openings 49 to the source region 20 and the drain region 25, a second interlevel dielectric layer 51 may be formed over the semiconductor device 100 and the first interlevel dielectric layer 40. The composition of the second interlevel dielectric layer 51 may be selected from the group consisting of silicon containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the second interlevel dielectric layer 51 include, any of the aforementioned materials in porous form, or in a form that changes during processing to or from being porous and/or permeable to being non-porous and/or non-permeable.

Via openings 49 may be formed to expose an upper surface of at least one of the source region 20 and the drain region 25. The via openings 49 may be formed using photolithography and etch processes. For example, a photoresist etch mask can be produced by applying a photoresist layer to the upper surface of a second interlevel dielectric layer 51, exposing the photoresist layer to a pattern of radiation, and then developing the pattern into the photoresist layer utilizing a resist developer. The photoresist etch mask may be positioned so that the portions of the second interlevel dielectric layer 51 and the underlying first interlevel dielectric layer 40 that are not protected by the photoresist etch mask may be etched in order to provide the via openings 49. The exposed portions of the second interlevel dielectric layer 51 and the first interlevel dielectric layer 40 are then removed by a selective etch.

The selective etch can remove the material of the second interlevel dielectric layer 51 and the first interlevel dielectric layer 40 selectively to at least the high-k dielectric material 31 of the multi-layer cap 30. The etch that removes the exposed portion of the second interlevel dielectric layer 51 and the first interlevel dielectric layer 40 may be an anisotropic etch. Examples of anisotropic etch process suitable for forming the via openings 49 include, but are not limited to, reactive-ion etching (RIE), ion beam etching, plasma etching and/or laser ablation. Because the etch process that forms the via openings 49 does not etch the high-k dielectric material 31 of the multi-layer cap 30, the upper surface and sidewall surface of the gate conductor 35 is protected from being exposed. In some embodiments, the inclusion of the high-k dielectric material 31 within the multi-layered cap 30, renders the multi-layered cap 30 more robust.

Figure 5:
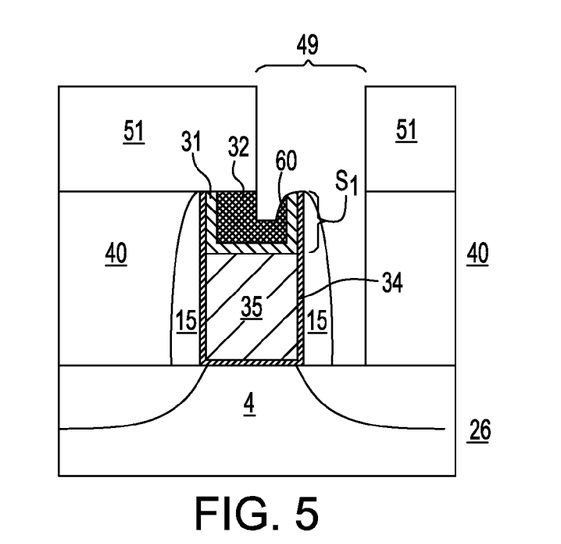
FIG. 5 is a side cross sectional view depicting a multi-layered dielectric cap that includes a high-k dielectric material that is present on a portion of a sidewall of the gate sidewall spacer that extends beyond an upper surface of the gate conductor and a dielectric cap spacer that is present on a portion of the high-k dielectric material that is present on the sidewall of the gate sidewall spacer, in accordance with one embodiment of the present disclosure.

FIG. 5 depicts a magnified view of one embodiment of etching via openings 49, wherein the high-k dielectric material 31 of the multi-layered cap 30 protects the sidewall of the at least one gate conductor 35. During the etching of the via openings 49, a portion of the dielectric fill 32 may be etched. A remaining portion of the dielectric fill 32 that is present on the high-k dielectric material 31 may provide the geometry of a spacer, which is hereafter referred to a dielectric cap spacer 60. The dielectric cap spacer 60 is typically present on a portion of the high-k dielectric material 31 that is present on the sidewall S1 of the gate sidewall spacer 15. The sidewall of the dielectric cap spacer 60 that is opposite the surface of the dielectric cap spacer 60 that is present on the high-k dielectric material 31 may have a convex curvature relative to the high-k dielectric material 31, as depicted in FIG. 5. In one embodiment, the dielectric cap spacer 60 is in direct contact with the high-k dielectric material 31, wherein the high-k dielectric material 31 is in direct contact with the portion of the at least one gate dielectric 34 that is present on the portion of the sidewall S1 of the gate sidewall spacer 15 that extends above the recessed upper surface of the at least one gate conductor 35. In one example, the dielectric cap spacer 60 is composed of silicon nitride ($Si_3N_4$).

Referring to FIG. 4, interconnect contacts 50 may be formed in the via openings 49. In some embodiments, the interconnect contacts 50 are in direct contact with the upper surface of at least one of the source region 20 and the drain region 25. Interconnect contacts 50 are formed by depositing a conductive metal into the via openings 49 using a deposition process, such as physical vapor deposition (PVD). Examples of physical vapor deposition (PVD) that are suitable for forming the interconnect contacts 50 include sputtering and plating. Examples of sputtering apparatuses suitable for forming the interconnect contacts 50 include DC diode type systems, radio frequency (RF) sputtering, magnetron sputtering, and ionized metal plasma (IMP) sputtering. The interconnect contacts 50 may also be formed using chemical vapor deposition. The interconnect contacts 50 may be composed of a conductive metal, such as tungsten, copper, aluminum, silver, gold, and alloys thereof. The interconnect contacts 50 are separated from the at least one gate conductor 35 by the gate sidewall spacer 15, and the multi-layered cap 30.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A semiconductor device comprising:
   a gate structure that is present on a channel portion of a semiconductor substrate that is present between a source region and a drain region, wherein the gate structure includes at least a gate conductor and a gate sidewall spacer that is adjacent to the at least one gate conductor, wherein an upper surface of the gate conductor is recessed relative to an upper surface of the gate sidewall spacer; and
   a multi-layered cap on the upper surface of the gate conductor, wherein the multi-layered cap includes a high-k dielectric material, wherein the multi-layered cap also includes a dielectric cap spacer that is present on a portion of the high-k dielectric material that is present on the sidewall of the gate sidewall spacer, wherein the high-k dielectric material includes a lower portion, a first lateral sidewall, and a second lateral sidewall, wherein the lower portion of the high-k dielectric material is located on an upper surface of the gate conductor, and wherein the first and second lateral sidewalls of the high-k dielectric material are spaced apart and extend vertically upward from the lower portion of the high-k dielectric material along the gate sidewall spacer in a direction away from the semiconductor substrate, wherein a first surface of the dielectric cap spacer is located in direct physical contact with the second lateral sidewall of the high-k dielectric material, and wherein a sidewall of the dielectric cap spacer located opposite to the first surface of the dielectric cap spacer has a convex curvature relative to the second lateral sidewall of the high-k dielectric material.

2. The semiconductor device of claim 1, wherein the gate structure includes a gate dielectric that is present between the gate conductor and the channel portion of a semiconductor substrate, wherein the gate dielectric has vertical portions that extend above the upper surface of the gate conductor.

3. The semiconductor device of claim 1, wherein a source region and a drain region are present in the semiconductor substrate on opposing sides of the channel portion of the semiconductor substrate.

4. The semiconductor device of claim 1, wherein the high-k dielectric material comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof.

5. The semiconductor device of claim 1, wherein the dielectric cap spacer comprises silicon oxide, silicon nitride, silicon oxynitride or a combination thereof.

6. The semiconductor device of claim 1, further comprising an interlevel dielectric layer located adjacent the gate structure, wherein an upper surface of the interlevel dielectric layer is coplanar with an uppermost surface of the multi-layered gate cap.

7. The semiconductor device of claim 1, wherein the multi-layered cap further comprises a dielectric fill material in direct physical contact with the first lateral sidewall, the second lateral sidewall and the lower portion of the high-k dielectric material, wherein upper surfaces of the first and second lateral sidewalls the high-k dielectric material are coplanar with an upper surface of the dielectric fill material, and wherein a bottom surface of the lower portion of the high-k dielectric material is in direct physical contact with the upper surface of the gate conductor.

8. The semiconductor device of claim 1, wherein the multi-layered cap further comprises an intermediate dielectric layer in direct physical contact with the first lateral sidewall, the second lateral sidewall and the lower portion of the high-k dielectric material, and a dielectric fill material in direct physical contact with the intermediate dielectric layer, wherein upper surfaces of the first and second lateral sidewalls of the high-k dielectric material, the intermediate dielectric layer and the dielectric fill material are coplanar with each other, and wherein a bottom surface of the lower portion of the high-k dielectric material is in direct physical contact with the upper surface of the gate condutor.

9. The semiconductor device of claim 6, further comprising another interlevel dielectric layer located on the interlevel dielectric layer, wherein an interconnect contact is present in the another interlevel dielectric layer and the interlevel dielectric layer.

10. The semiconductor device of claim 9, wherein a portion of the interconnect contact is located on a sidewall of the dielectric cap spacer.

11. A semiconductor device comprising:
a gate structure that is present on a channel portion of a semiconductor substrate that is present between a source region and a drain region, wherein the gate structure includes a gate dielectric, at least a gate conductor and a gate sidewall spacer having sidewalls in direct contact with vertical sidewalls of the gate dielectric, wherein an upper surface of the gate conductor is recessed relative to an upper surface of the gate sidewall spacer; and
a multi-layered cap on the upper surface of the gate conductor, wherein the multi-layered cap includes a high-k dielectric material that is present on a portion of a sidewall of the gate sidewall spacer that extends beyond an upper surface of the gate conductor, wherein the multi-layered cap also includes a dielectric cap spacer that is present on a portion of the high-k dielectric material that is present on the sidewall of the gate sidewall spacer, wherein the high-k dielectric material includes a lower portion, a first lateral sidewall, and a second lateral sidewall, wherein the lower portion of the high-k dielectric material is located on an upper surface of the gate conductor, and wherein the first and second lateral sidewalls of the high-k dielectric material are spaced apart and extend vertically upward from the lower portion of the high-k dielectric material along the gate sidewall spacer in a direction away from the semiconductor substrate, wherein a first surface of the dielectric cap spacer is located in direct physical contact with the second lateral sidewall of the high-k dielectric material, and wherein a sidewall of the dielectric cap spacer located opposite to the first surface of the dielectric cap spacer has a convex curvature relative to the second lateral sidewall of the high-k dielectric material.

12. The semiconductor device of claim 11, wherein the high-k dielectric material comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof.

13. The semiconductor device of claim 11, wherein the dielectric cap spacer comprises silicon oxide, silicon nitride, silicon oxynitride or a combination thereof.

14. The semiconductor device of claim 11, further comprising an interlevel dielectric layer located adjacent the gate structure, wherein an upper surface of the interlevel dielectric layer is coplanar with an uppermost surface of the multi-layered gate cap.

15. The semiconductor device of claim 11, wherein the multi-layered cap further comprises a dielectric fill material in direct physical contact with the first lateral sidewall, the second lateral sidewall and the lower portion of the high-k dielectric material, wherein upper surfaces of the first and second lateral sidewalls of the high-k dielectric material are coplanar with an upper surface of the dielectric fill material, and wherein a bottom surface of the lower portion of the high-k dielectric material is in direct physical contact with the upper surface of the gate conductor.

16. The semiconductor device of claim 11, wherein the multi-layered cap further comprises an intermediate dielectric layer in direct physical contact with the first lateral sidewall, the second lateral sidewall and the lower portion of the high-k dielectric material, and a dielectric fill material in direct physical contact with the intermediate dielectric layer, wherein upper surfaces of the first and second lateral sidewalls of the high-k dielectric material, the intermediate dielectric layer and the dielectric fill material are coplanar with each other, and wherein a bottom surface of the lower portion of the high-k dielectric material is in direct physical contact with the upper surface of the gate conductor.

17. The semiconductor device of claim 14, further comprising another interlevel dielectric layer located on the interlevel dielectric layer, wherein an interconnect contact is present in the another interlevel dielectric layer and the interlevel dielectric layer.

18. The semiconductor device of claim 17, wherein a portion of the interconnect contact is located on a sidewall of the dielectric cap spacer.

* * * * *